(12) United States Patent
Choi et al.

(10) Patent No.: US 9,992,881 B2
(45) Date of Patent: Jun. 5, 2018

(54) ROLLABLE DISPLAY

(71) Applicant: SAMSUNG DISPLAY CO., LTD., Yongin-si, Gyeonggi-Do (KR)

(72) Inventors: Jinhwan Choi, Yongin-si (KR); Taean Seo, Yongin-si (KR); Junghun Lee, Yongin-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 0 days. days.

(21) Appl. No.: 15/498,641

(22) Filed: Apr. 27, 2017

(65) Prior Publication Data

US 2017/0332496 A1 Nov. 16, 2017

(30) Foreign Application Priority Data

May 12, 2016 (KR) .......................... 10-2016-0058181

(51) Int. Cl.
| | |
|---|---|
| *H05K 1/00* | (2006.01) |
| *H05K 5/00* | (2006.01) |
| *H05K 1/02* | (2006.01) |
| *H05K 7/14* | (2006.01) |
| *H01L 27/32* | (2006.01) |
| *H01L 51/00* | (2006.01) |

(52) U.S. Cl.
CPC ........... *H05K 5/0017* (2013.01); *H05K 1/028* (2013.01); *H05K 7/1427* (2013.01); *H01L 27/3244* (2013.01); *H01L 51/0097* (2013.01); *H05K 2201/051* (2013.01)

(58) Field of Classification Search
CPC .. H05K 1/02; H05K 5/00; H05K 5/02; H05K 7/02; H05K 7/04; G06F 1/16; G06F 3/041; G09G 3/34; G09G 5/00
USPC ............. 361/749; 345/31, 85, 156; 116/307; 40/479
See application file for complete search history.

(56) References Cited

U.S. PATENT DOCUMENTS

| | | | | |
|---|---|---|---|---|
| 4,003,332 | A * | 1/1977 | Berge ...................... | G09F 11/23 116/307 |
| 7,710,370 | B2 * | 5/2010 | Slikkerveer ............... | G09F 9/35 345/31 |
| 9,836,088 | B2 * | 12/2017 | Choi ..................... | G06F 1/1652 |

(Continued)

FOREIGN PATENT DOCUMENTS

| | | |
|---|---|---|
| KR | 10-1049240 | 7/2011 |
| KR | 10-2013-0055263 | 5/2013 |

(Continued)

*Primary Examiner* — Xiaoliang Chen
(74) *Attorney, Agent, or Firm* — F. Chau & Associates, LLC

(57) ABSTRACT

A rollable display may include a polyhedral drum and a flexible panel. The polyhedral drum includes a plurality of substantially flat surface portions and a plurality of curved surface portions. The plurality of curved surface portions connect adjacent flat surface portions to each other on an outer circumferential surface of the polyhedral drum. The flexible panel is disposed around the outer circumferential surface of the polyhedral drum. A top portion and a tail portion of the flexible panel may overlap each other on substantially the same flat surface portion of the polyhedral drum. The top portion and the tail portion correspond to respective ends of the flexible panel.

15 Claims, 6 Drawing Sheets

(56) References Cited

U.S. PATENT DOCUMENTS

| | | | |
|---|---|---|---|
| 2011/0227822 A1* | 9/2011 | Shai | G06F 1/1615 345/156 |
| 2013/0127799 A1* | 5/2013 | Lee | G06F 1/1652 345/204 |
| 2015/0227171 A1* | 8/2015 | Choi | G06F 1/1652 361/749 |
| 2016/0231843 A1* | 8/2016 | Kim | G06F 3/0412 |
| 2017/0027067 A1* | 1/2017 | Choi | G06F 1/1652 |

FOREIGN PATENT DOCUMENTS

| | | |
|---|---|---|
| KR | 10-2014-0101611 | 8/2014 |
| KR | 10-2015-0095075 | 8/2015 |
| KR | 10-1570869 | 11/2015 |

\* cited by examiner

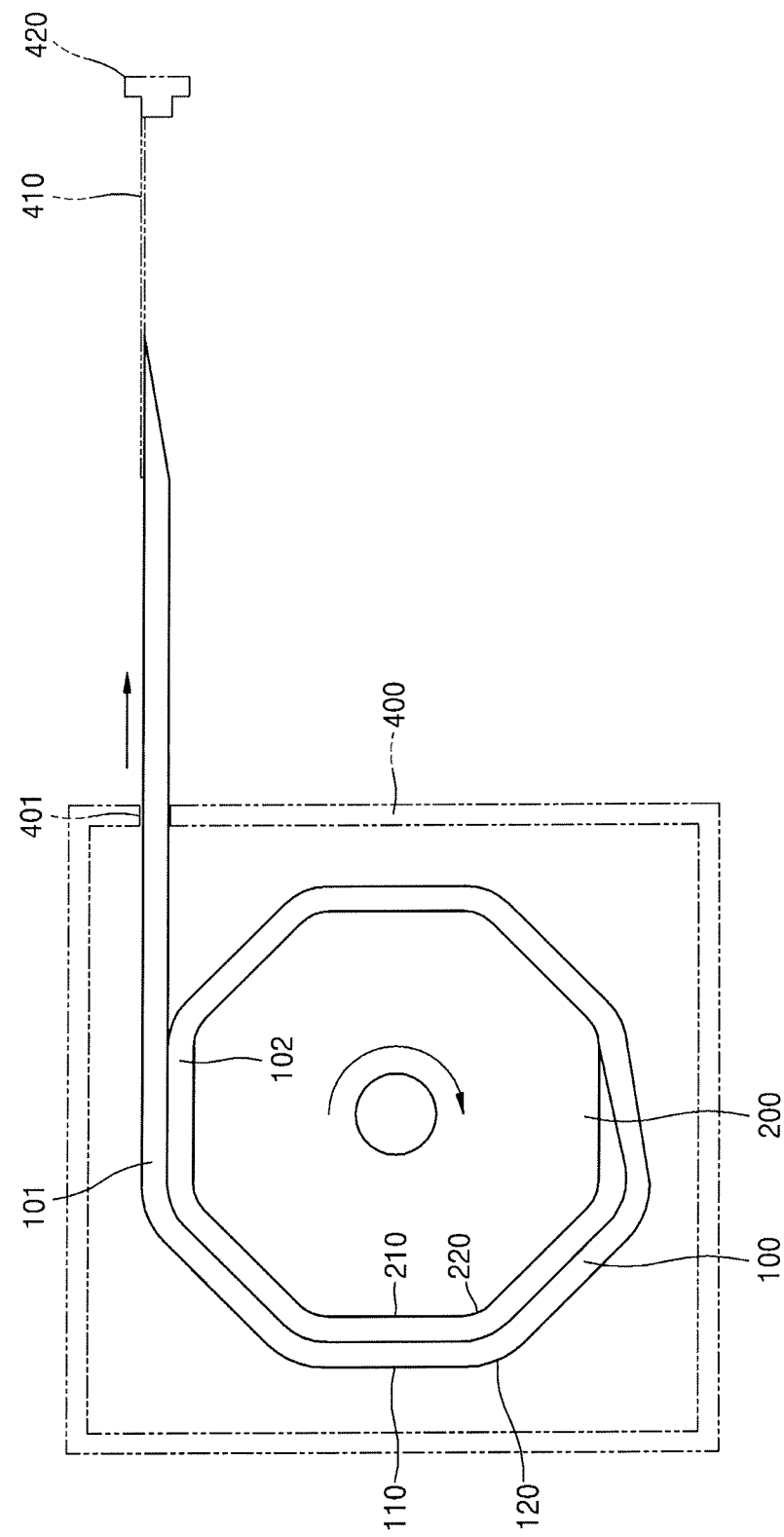

ROLLABLE DISPLAY

CROSS-REFERENCE TO RELATED APPLICATIONS

This application claims priority to and the benefit of Korean Patent Application No. 10-2016-0058181, filed on May 12, 2016 in the Korean Intellectual Property Office, the disclosure of which is incorporated by reference herein in its entirety.

TECHNICAL FIELD

The present invention relates to a rollable display.

DISCUSSION OF RELATED ART

Display panels, such as organic light-emitting display devices may be flexible and therefore may be rolled. When a flexible display panel remains in a rolled state for a substantial amount of time, a shear stress is applied to a bent portion of the flexible display panel. When a sheer stress is applied to the bent portion for an extensive amount of time, a protection film on the flexible display may be peeled off or may become deformed.

SUMMARY

Exemplary embodiments of the present invention provide a rollable display. The rollable display includes a polyhedral drum and a flexible panel. The polyhedral drum includes a plurality of substantially flat surface portions and a plurality of curved surface portions. The plurality of curved surface portions connect adjacent flat surface portions to each other on an outer circumferential surface of the polyhedral drum. The flexible panel is disposed around the outer circumferential surface of the polyhedral drum. A top portion and a tail portion of the flexible panel overlap each other on substantially a same flat surface portion of the plurality of substantially flat surface portions of the polyhedral drum. The top portion and the tail portion correspond to respective ends of the flexible panel.

A thickness of a portion of the flexible panel on the substantially flat surface portion where the top portion and the tail portion overlap each other may be substantially equal to a thickness of a portion of the flexible panel on adjacent flat surface portions.

The top portion and the tail portion may have a tapered shape.

The tapered shapes of the top portion and the tail portion may be tapered in different directions.

At least one layer corresponding to a portion of the flexible panel may be disposed between the top portion and the tail portion when the flexible panel is in a wound state.

A stack thickness of the flexible panel on the flat surface portion on which the top portion, the tail portion, and the at least one layer disposed between the top portion and the tail portion thereon are stacked may be substantially equal to a stack thickness of the flexible panel on each of the other flat surface portions.

The at least one layer disposed between the top portion and the tail portion may have a tapered shape.

The flexible panel may include a main body, an upper film, and a lower film. The upper film and the lower film may respectively cover an upper surface and a lower surface of the main body.

The tail portion may be a fixed end fixed to one of the plurality of flat surface portions of the polyhedral drum, and the top portion may be a non-fixed end.

The top portion and the tail portion may include a non-display region.

One of a driving chip, a connector, and a circuit board may be arranged in the non-display region.

The rollable display may further include a housing, a lead-out film, and a stopper. The housing may be configured to accommodate the polyhedral drum and the flexible panel. The lead-out film may include a first end coupled to the non-display region of the top portion and a second end led out via an aperture of the housing. The stopper may be coupled to the second of the lead-out film. The stopper may be configured to pull the lead-out film outside the housing.

The rollable display may further include a driving source configured to rotate the polyhedral drum.

The top portion may be configured to be manually wound around or unwound from the polyhedral drum.

The polyhedral drum may include eight flat surface portions and eight curved surface portions. The eight flat surface portions and the eight curved surface portions may alternate with each other.

Exemplary embodiments of the present invention provide a rollable display. The rollable display includes a polyhedral drum and a flexible display. The polyhedral drum includes a plurality of substantially flat surface portions. The polyhedral drum further includes a plurality of curved surface portions disposed between adjacent flat surface portions on an outer circumferential surface of the polyhedral drum. The flexible panel is disposed around the outer circumferential surface of the polyhedral drum. A top portion and a tail portion of the flexible panel overlap each other on substantially the same flat surface portion of the polyhedral drum. The top portion and the tail portion have a tapered shape tapered in different directions.

At least one layer corresponding to a portion of the flexible panel may be disposed between the top portion and the tail portion when the flexible panel is in a wound state.

A thickness of a portion of the flexible panel on the flat surface portion where the top portion and the tail portion overlap each other may be substantially equal to a thickness of a portion of the flexible panel on adjacent flat surface portions.

Exemplary embodiments of the present invention provide a rollable display. The rollable display includes a polyhedral drum and a flexible panel. The polyhedral drum includes surface portions. The flexible panel is disposed around the outer circumferential surface of the polyhedral drum. A top portion and tail portion of the flexible panel overlap each other on substantially the same surface portion of the polyhedral drum. A thickness of the portion where the top portion and the tail portion overlap is substantially equal to a thickness of a portion of the flexible panel on adjacent surface portions.

The top portion and the tail portion may have a tapered shape.

BRIEF DESCRIPTION OF THE DRAWINGS

These and/or other aspects will become apparent and more readily appreciated from the following description of the exemplary embodiments, taken in conjunction with the accompanying drawings, in which:

FIG. 3A is a cross-sectional view illustrating an unwound state of a rollable display of FIG. 2 according to an exemplary embodiment of the present invention;

DETAILED DESCRIPTION OF THE EMBODIMENTS

Figure 1:
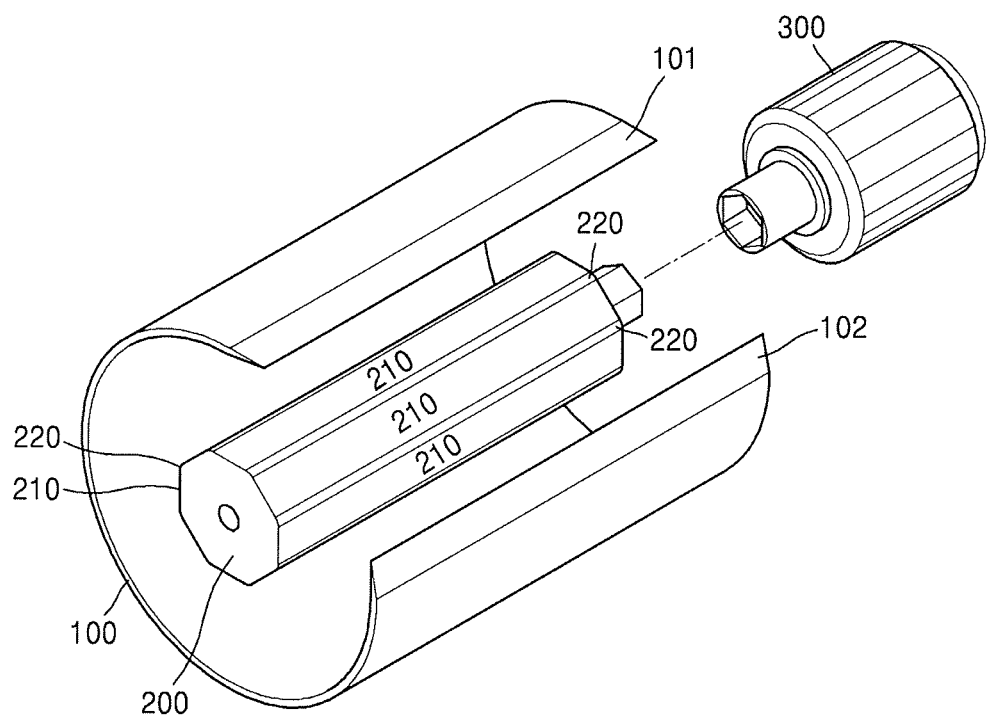
FIG. 1 is an exploded perspective view illustrating a rollable display according to an exemplary embodiment of the present invention.

As the present invention allows for various changes and numerous embodiments, exemplary embodiments of the present invention will be illustrated in the drawings and described in detail herein. Hereinafter, aspects and features of embodiments of the present invention and a method for accomplishing them will be described more fully with reference to the accompanying drawings; however, the present invention may be embodied in many different forms and should not be construed as limited to the embodiments set forth herein. Those components that are the same or are similar to components in other figures may be referred to by the same reference numeral in all of the figures and redundant explanations may be omitted.

It will be understood that when a layer, region, or component is referred to as being "formed on" or "disposed on" another layer, region, or component, it can be directly or indirectly formed or disposed on the other layer, region, or component. Therefore, intervening layers, regions, or components may be present.

Sizes of elements in the drawings may be exaggerated for convenience of explanation and the following embodiments of the present invention are not limited thereto.

Figure 2:
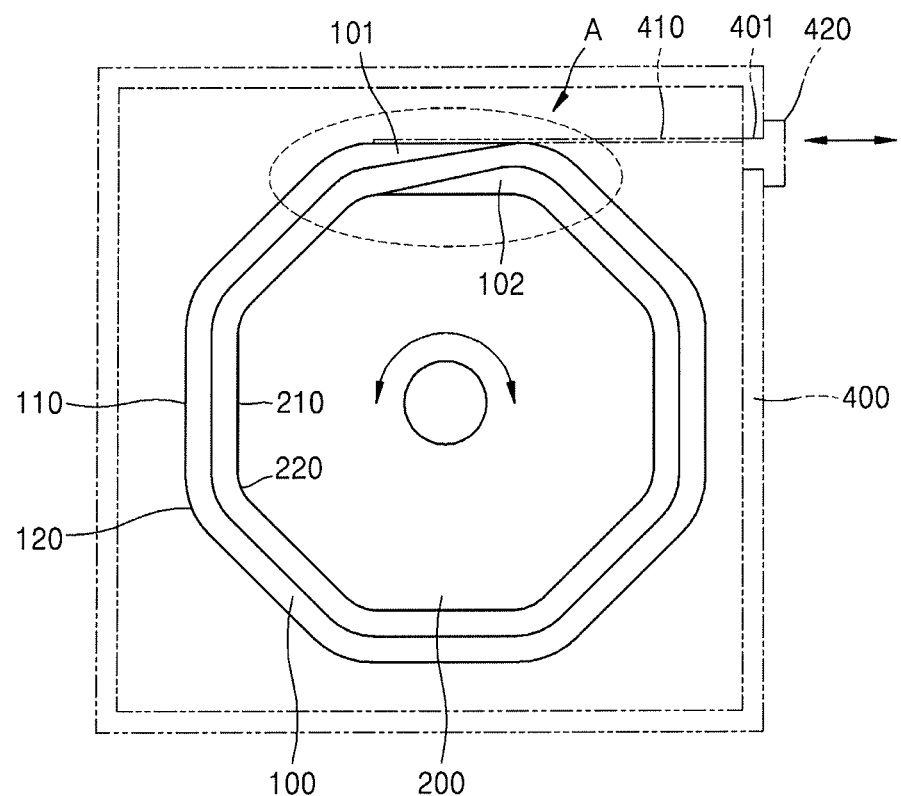
FIG. 2 is a cross-sectional view illustrating a combined state of a rollable display of FIG. 1 according to an exemplary embodiment of the present invention.

FIG. 1 illustrates a rollable display according to an exemplary embodiment of the present invention. FIG. 2 illustrates a combined state of a rollable display according to an exemplary embodiment of the present invention.

The rollable display may include a flexible panel 100. The flexible panel 100 may be flexibly bent. The flexible panel 100 may include a flexible substrate, a thin film transistor (TFT), a light-emitting device, and an encapsulation layer. The light-emitting device may display an image. The encapsulating layer may cover and protect the TFT and the light-emitting device. The TFT, the light-emitting device, and the encapsulation layer may be disposed on the flexible substrate in a stacked configuration; however, exemplary embodiments of the present invention are not limited thereto. Since the flexible substrate may be used as an alternative to a rigid glass substrate, the flexible panel 100 may be rolled, for example, wound or unwound. According to an exemplary embodiment of the present invention, an organic light-emitting display device or the like may be used as the flexible panel 100.

The rollable display may further include a polyhedral drum 200. The polyhedral drum 200 may serve as a central axis for winding the flexible panel 100 thereon. Accordingly, the flexible panel 100 may be wound around an outer circumferential surface of the polyhedral drum 200. The polyhedral drum 200 may include a plurality of substantially flat surface portions 210. The polyhedral drum 200 may further include a plurality of curved surface portions 220. The plurality of substantially flat surface portions may be alternately formed on the outer circumferential surface of the polyhedral drum 200. The curved surface portions 220 may be disposed between each adjacent substantially flat surface portions 210. The curved surface portions 220 may connect the substantially flat surface portions 210 to each other. According to an exemplary embodiment of the present invention, the polyhedral drum 200 may include approximately eight substantially flat surface portions 210 and approximately eight curved surface portions 220. However, exemplary embodiments of the present invention are not limited thereto.

The flexible panel 100 may further include a tail portion 102. The tail portion 102 may correspond to a fixed end of the flexible panel 100. The tail portion 102 may be fixedly attached to one of the substantially flat surface portions 210 of the polyhedral drum 200. The flexible panel 100 may further include a top portion 101. The top portion 101 of the flexible panel 100 may correspond to an unattached end of the flexible panel 100. According to an exemplary embodiment of the present invention, the flexible panel 100 may be wound around the substantially flat surface portions 210. As such, the curved surface portions 220 of the polyhedral drum 200 may be positioned in a direction toward the top portion 101. Accordingly, as illustrated in FIG. 2, substantially flat portions 110 which may correspond to the substantially flat surface portions 210 and curved portions 120 which may correspond to the curved surface portions 220 may be formed around the circumferential surface of the polyhedral drum 200 on the flexible panel 100.

The rollable display may further include a driving source 300, a housing 400, a film 410, and a stopper 420. The driving source 300 may rotate the polyhedral drum 200. The housing 400 may accommodate the polyhedral drum 200, the flexible panel 100, and the driving source 300. The film 410 may include an end coupled to the top portion 101 of the flexible panel 100. The end coupled to the top portion 101 may guide the top portion 101 during the removal thereof from the housing 400 via an aperture 401. The stopper 420 may be coupled to another end of the film 410. The stopper 420 may block the film 410 from re-entering the housing 400. The stopper 420 may also function as a knob for pulling the film 410 outside of the housing 400.

Figure 3B:
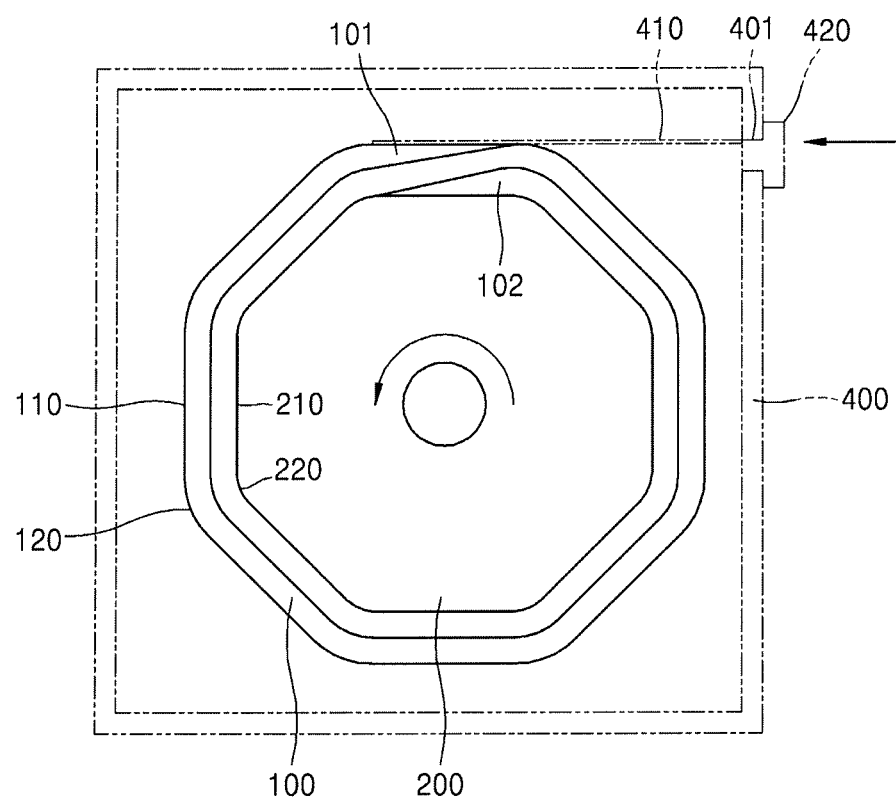
FIG. 3B is a cross-sectional view illustrating a wound state of a rollable display of FIG. 2 according to an exemplary embodiment of the present invention.

Accordingly, when the stopper 420 is pulled toward the outside of the housing 400 or the driving source 300 is driven, the polyhedral drum 200 may be rotated in an unwinding direction. At substantially the same time, the top portion 101 of the flexible panel 100 may be guided out of the housing 400 via the aperture 401. Therefore, the flexible panel 100 may be unwound as illustrated in FIG. 3A. Alternatively, to wind the flexible panel 100, the driving source 300 may rotate the polyhedral drum 200 in a winding direction. Therefore, as illustrated in FIG. 3B, the top portion 101 of the flexible panel 100 may be pulled into the housing 400. At substantially the same time, the flexible panel 100 may be wound around the polyhedral drum 200.

FIG. 2 illustrates the flexible panel 100 fully wound around the polyhedral drum 200. The top portion 101 may overlap one of the substantially flat surface portions 210 of the polyhedral drum 200. The tail portion 102 may also overlap at least one of the substantially flat surface portions 210 of the polyhedral drum 200. The top portion 101 and the tail portion 102 may have tapered shapes narrowing in opposite directions; however, exemplary embodiments of the present invention are not limited thereto. As such, the top portion 101 and the tail portion 102 may be stacked on substantially the same flat surface portion 210 such that the tapered shapes of the top portion 101 and the tail portion 102 are substantially equal. Therefore, a stack including the top portion 101 and the tail portion 102 may have substantially a same thickness as portions of the flexible panel 100 stacked on adjacent substantially flat surface portions 210.

Figure 4:
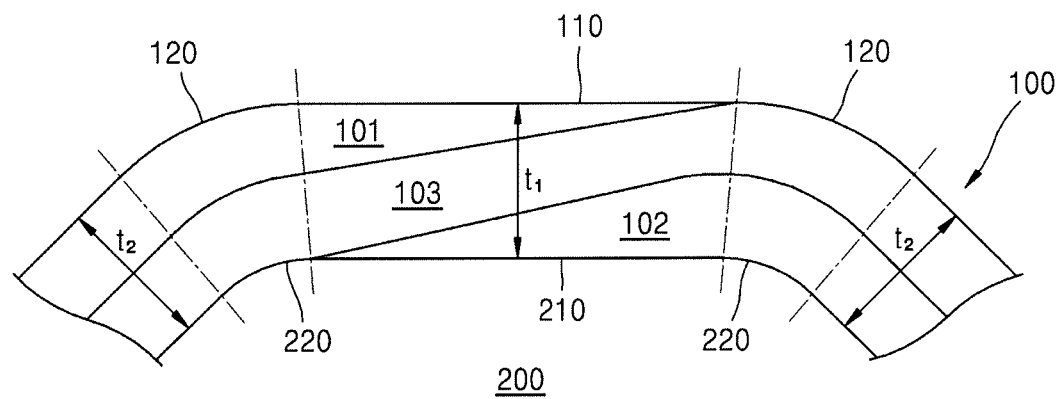
FIG. 4 is a magnified cross-sectional view illustrating a portion of FIG. 2 according to an exemplary embodiment of the present invention.

FIG. 4 illustrates a portion of a rollable display according to an exemplary embodiment of the present invention.

Referring to FIG. 4, the top portion 101 and the tail portion 102 of the flexible panel 100 may be stacked on each other on a flat surface portion 210 of the polyhedral drum 200. A portion of the flexible panel 100 may be disposed as an intervening layer 103 between the top portion 101 and the tail portion 102.

Referring to FIG. 4, the flexible panel 100 may be wound around the polyhedral drum 200 three times on the substantially flat surface portion 210 on which the top portion 101 and the tail portion 102 are stacked. Therefore, a three-layered stack including the tail portion 102, the intervening layer 103, and the top portion 101 may be formed. A two-layered stack may be formed on other adjacent substantially flat surface portions 210. However, exemplary embodiments of the present invention are not limited thereto.

Although the flexible panel 100 may be wound as illustrated in FIG. 4, a stack thickness $t_1$ of the flexible panel 100 on the substantially flat surface portion 210 on which the top portion 101 and the tail portion 102 are stacked may be substantially the same as a stack thickness $t_2$ of the flexible panel 100 on each of the other adjacent substantially flat surface portions 210. Accordingly, although additional layers may be formed on the flat surface portion 210 including the top portion 101 and the tail portion 102 stacked thereon than on the other flat surface portions 210 due to overlapping between the top portion 101 and the tail portion 102, the stack thicknesses $t_1$ and $t_2$ on the substantially flat surface portions 210 may remain as substantially equal to each other. Therefore, the flexible panel 100 on the flat surface portion 210 including the top portion 101 and the tail portion 102 thereon might not protrude beyond the flexible panel 100 on the other adjacent flat surface portions 210.

The top portion 101 and the tail portion 102 may have tapered shapes narrowing in opposite directions. The intervening layer 103 may also have a tapered shape. However, exemplary embodiments of the present invention are not limited thereto.

The tapered shapes narrowing in different directions of the top portion 101 and the tail portion 102 may be combined with each other. Therefore, the top portion 101 and the tail portion 102 may appear as a single layer. Since the intervening layer 103 may also have a tapered shape, the stack thickness $t_1$ of a three-layered stack may be substantially equal to the stack thickness $t_2$ of the flexible panel 100 on substantially each of the other adjacent substantially flat surface portions 210. The intervening layer 103 may have a substantially uniform thickness similar to the other adjacent portions of the flexible panel 100. The top portion 101 and the tail portion 102 may solely have tapered shapes in order to coordinate the stack thickness $t_1$ with the stack thickness $t_2$. However, according to an exemplary embodiment of the present invention, the intervening layer 103 may also have a tapered shape. Therefore, the top portion 101, the intervening layer 103, and the tail portion 102, may have slight inclinations in thickness variations.

Accordingly, the flexible panel 100 might not have protruding portions while in a wound state. Therefore, a concentration of a shear stress on one portion of the flexible panel 100 may be prevented.

Since the portions of the flexible panel 100 on the substantially flat surface portions 210 except for the flat surface portion 210 having the top portion 101 and the tail portion 102 thereon include two layers when the flexible panel is in a wound state, a large shear stress might not be applied to the portions of the flexible panel 100. However, in the portion of the flexible panel 100 including a stack of the top portion 101 and the tail portion 102, a step may be formed. Therefore, a shear stress may concentrate on the portion including a stack of the top portion 101 and the tail portion 102. Since the top portion 101 and the tail portion 102 may have tapered shapes, no steps might be generated. Accordingly, the portion of the flexible panel 100 including a stack of the top portion 101 and the tail portion 102 may have substantially the same thickness as other adjacent portions including two layers including either the top portion 101 and the intervening layer 103 or the intervening layer 103 and the bottom portion 102. Therefore, a stable rolling structure having substantially no shear stress concentrations on one portion thereof may be achieved.

Therefore, peeling off of a protection film, may be prevented.

Figure 5:
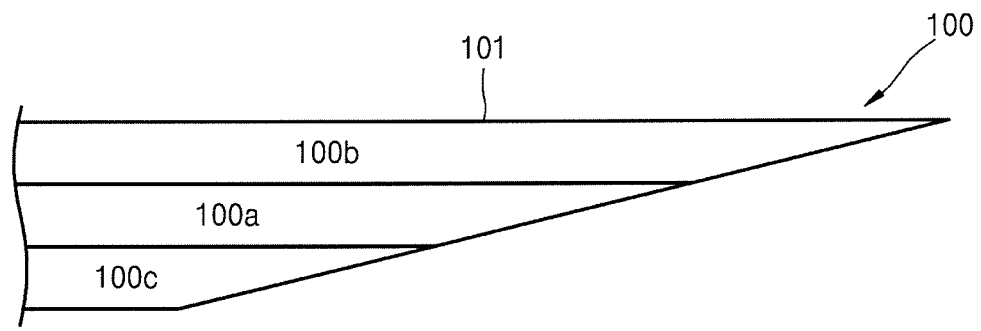
FIG. 5 is a cross-sectional view illustrating a stack of a main body and upper and lower films of a rollable display of FIG. 4 according to an exemplary embodiment of the present invention.

FIG. 5 illustrates a stack of a main body and upper and lower films of a rollable display according to an exemplary embodiment of the present invention.

FIG. 5 illustrates the top portion 101 of the flexible panel 100. The flexible panel 100 may further include a main body 100a, an upper film 100b, and a lower film 100c. The upper film 100b may be disposed on an upper surface of the panel main body 100a. The lower film 100c may be disposed on a lower surface of the panel main body 100a. The upper film 100b and the lower film 100c may cover and may protect the panel main body 100a. If a shear stress is concentrated on the top portion 101, the upper film 100b and the lower film 100c may be peeled off. According to an exemplary embodiment of the present invention, a shear stress might not be concentrated on a particular portion of the flexible panel 100 even when the flexible panel 100 is in a wound state. Therefore, peeling off of a protection film may be effectively reduced. Moreover, a substantial portion of the area of the flexible panel 100 may include the substantially flat portions 110 on the substantially flat surface portions 210 of the polyhedral drum 200 even when the panel flexible panel 100 is in a wound state similarly to an unwound state. According to an exemplary embodiment of the present invention, the curved portions 120 may include large curvatures on the polyhedral drum 200. For example, about eight curved surface portions 220. Therefore, a large shear stress might not be exerted on the flexible panel 100.

Since a substantial portion of the area of the flexible panel 100 may be substantially flat even when the flexible panel 100 is in a wound state, the curved portions 120 disposed between the substantially flat portions 110 may have large curvatures. Therefore, the curved portions disposed between the substantially flat portions 110 may be slightly bent. Additionally, a portion of the flexible panel 100 including a stack of the top portion 101 and the tail portion 102 may prevent formation of a step difference as the top portion 101 and the tail portion 102 may have tapered shapes. Therefore, a large shear stress might not be applied to substantially any area of the flexible panel 100. As such, a peeling off of a protection film may be effectively reduced.

The flexible panel 100 may include a display region and a non-display region. An image may be displayed on the display region. An image might not be displayed on the non-display region. The top portion 110 and the tail portion 120 may include the display region. A driving chip, a connector, a circuit board, and the like, for example, may be arranged on the non-display region.

Figure 6:
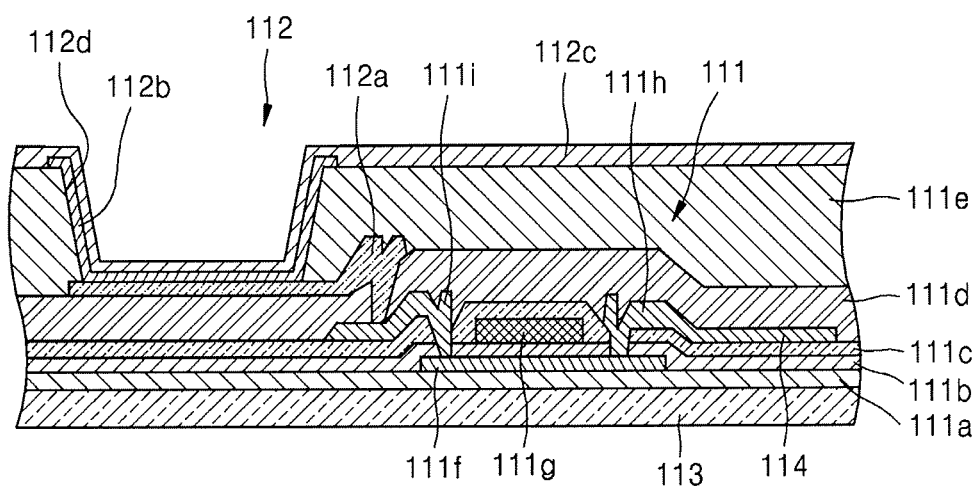
FIG. 6 is a cross-sectional view illustrating a structure of a display region of a rollable display of FIG. 2 according to an exemplary embodiment of the present invention.

FIG. 6 illustrates a structure of a display region of a rollable display according to an exemplary embodiment of the present invention.

Referring to FIG. 6, the display region may include a TFT 111 and an organic light-emitting device 112. An active layer 111f may be formed on a buffer layer 111a. The buffer layer 111a may be adjacent to a flexible substrate 113. The active layer 111f may include a source region and a drain region. The source region and the drain region may be doped with N-type or P-type impurities in a high concentration. The active layer 111f may include an oxide semiconductor. For example, the oxide semiconductor may include an oxide of Group 4, 12, 13, and/or 14 metal elements, such as zinc (Zn), indium (In), gallium (Ga), stannum (Sn), cadmium (Cd), germanium (Ge), and hafnium (Hf), and/or a combination thereof. For example, the active layer 111f may include G-I—Z—O [$(In_2O_3)a(Ga_2O_3)b(ZnO)c$], wherein a, b, and c are real numbers that respectively satisfy $a \geq 0$, $b \geq 0$, and $c > 0$. A gate insulating layer 111b may be formed on the active layer 111f. A gate electrode 111g may be formed on the gate insulating layer 111b. A source electrode 111h and a drain electrode 111i may be formed on the gate electrode 111g. An interlayer insulating layer 111c may be formed between the gate electrode 111g and each of the source electrode 111h and the drain electrode 111i. A passivation layer 111d may be disposed between an anode 112a of the organic light-emitting device 112 and each of the source electrode 111h and the drain electrode 111i.

An insulative planarization layer 111e may be formed on the anode 112a. The insulative planarization layer 11e may include, for example, acryl. An aperture 112d may be formed in the insulative planarization layer 111e. Accordingly, the organic light-emitting device 112 may be formed.

The organic light-emitting device 112 may display predetermined image information by emitting red light, green light, and blue light as a current flows there through. The organic light-emitting device 112 may include the anode 112a, a cathode 112c, and an emission layer 112b. The anode 112a may be connected to the drain electrode 111i of the TFT 111. A positive voltage may be applied to the anode 112a. A cathode 112c may be formed to cover substantially the entire pixel. A negative voltage may be applied to the cathode 112c. The emission layer 112b may be disposed between the anode 112a and the cathode 112c. The emission layer 112b may emit light.

A hole injection layer (HIL), a hole transport layer (HTL), an electron transport layer (ETL), and an electron injection layer (EIL) may be stacked adjacent to the emission layer 112b.

The emission layer 112b may be individually formed in substantially each pixel to form a single unit pixel. The single unit pixel may include pixels that emit red light, green light, and blue light; however, exemplary embodiments of the present invention are not limited thereto. The emission layers 112b formed in the pixels may be spaced apart from each other. Alternatively, the emission layer 112b may be commonly formed over substantially the entire pixel region. The emission layer 112b may be commonly formed over substantially the entire pixel region irrespective of locations of the pixels. The emission layer 112b may be formed by stacking a light-emitting substance that may emit a red light, a light-emitting substance that may emit a green light, and a light-emitting substance that may emit a blue light. Alternatively, the emission layer 112b may be formed by mixing a light-emitting substance that may emit a red light, a light-emitting substance that may emit a green light, and a light-emitting substance that may emit a blue light. Any combination of various colors that may be capable of emitting a white light may be utilized. The flexible panel 100 may further include a color converting layer or a color filter. The color converting layer or the color filter may covert the white light into a light of another color.

A thin film encapsulation layer may be further formed on the cathode 112c. The thin film encapsulation layer may include an organic layer and an inorganic layer. The organic layer and the inorganic layer may be alternately stacked.

Since the flexible panel 100 may be flexibly deformed, the flexible panel 100 may be wound around the outer circumferential surface of the polyhedral drum 200.

To unwind the rollable display, the top portion 101 may be guided out of the housing 400, as illustrated in FIG. 3A. When the flexible panel 100 is unwound from the polyhedral drum 200, a user may be able to view a plane image displayed on the flexible panel 100 in a flat state.

If the display apparatus is to be stored or carried, the flexible panel 100 may be wound by rotating the polyhedral drum 200, as illustrated in FIG. 3B. Thus, the flexible panel 100 may be protected by being wound around the polyhedral drum 200. Although the flexible panel 100 may be maintained in a wound state for a substantial amount of time, damage due to a shear stress, such as peeling off of a protection film of the display apparatus, may be prevented.

As illustrated in FIG. 3A, the rollable display may be unwound by rotating the polyhedral drum 200 by using the driving source 300. Alternatively, the rollable display may be unwound by rotating the polyhedral drum 200 by pulling the stopper 420, as illustrated in FIG. 3A.

Figure 7:
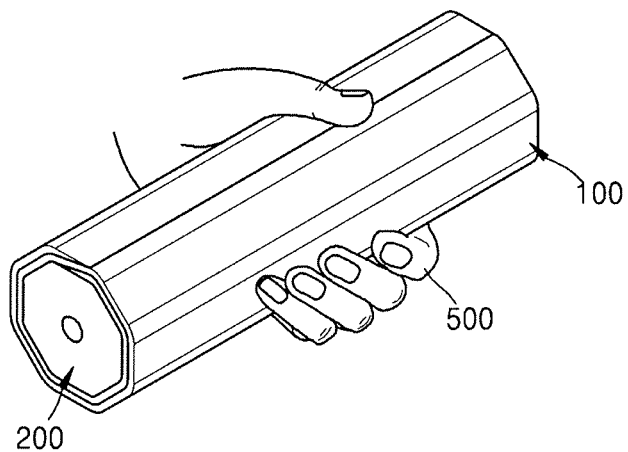
FIG. 7 is a perspective view of a rollable display according to an exemplary embodiment of the present invention.

Exemplary embodiments of the present invention provide for a structure for connecting the polyhedral drum 200 to the driving source 300 in order to rotate the polyhedral drum 200 and accommodating and protecting the flexible panel 100 within the housing 400; however, exemplary embodiments of the present invention are not limited thereto. Therefore, a simplified structure may be provided in which a user may directly wind or unwind the polyhedral drum 200 by hand as illustrated in FIG. 7.

Accordingly, in the case of a rollable display, a shear stress applied to a flexible panel in a wound state may be effectively reduced. Therefore, damage, such as peeling-off or deformation of a protection film in the rollable display, may be prevented. Additionally, degradation of the flexible panel due to rolling may be reduced; thereby a reliability of the flexible panel may be increased.

While one or more exemplary embodiments have been described with reference to the figures, it will be understood by those of ordinary skill in the art that various changes in form and details may be made therein without departing from the spirit and scope of the instant disclosure.

What is claimed is:
1. A rollable display comprising:
a polyhedral drum comprising a plurality of substantially flat surface portions and a plurality of curved surface portions, wherein the plurality of curved surface por- tions connect adjacent flat surface portions to each other on an outer circumferential surface of the polyhedral drum; and a flexible panel disposed around the outer circumferential surface of the polyhedral drum, wherein a top portion and a tail portion of the flexible panel overlap each other on substantially a same flat surface portion of the plurality of substantially flat surface portions of the polyhedral drum, and wherein the top portion and the tail portion correspond to respective ends of the flexible panel.

2. The rollable display of claim 1, wherein a thickness of a portion of the flexible panel on the substantially flat surface portion where the top portion and the tail portion overlap each other is substantially equal to a thickness of a portion of the flexible panel on adjacent flat surface portions.

3. The rollable display of claim 2, wherein the top portion and the tail portion have a tapered shape.

4. The rollable display of claim 3, wherein the tapered shapes of the top portion and the tail portion are tapered in different directions.

5. The rollable display of claim 3, wherein at least one layer corresponding to a portion of the flexible panel is disposed between the top portion and the tail portion when the flexible panel is in a wound state.

6. The rollable display of claim 5, wherein a stack thickness of the flexible panel on the flat surface portion on which the top portion, the tail portion, and the at least one layer disposed between the top portion and the tail portion thereon are stacked is substantially equal to a stack thickness of the flexible panel on each of the other flat surface portions.

7. The rollable display of claim 5, wherein the at least one layer disposed between the top portion and the tail portion has a tapered shape.

8. The rollable display of claim 1, wherein the flexible panel comprises a main body, an upper film, and a lower film, and wherein the upper film and the lower film respectively cover an upper surface and a lower surface of the main body.

9. The rollable display of claim 1, wherein the tail portion is a fixed end fixed to one of the plurality of flat surface portions of the polyhedral drum, and the top portion is a non-fixed end.

10. The rollable display of claim 9, wherein the top portion and the tail portion comprise a non-display region.

11. The rollable display of claim 10, wherein one of a driving chip, a connector, and a circuit board is arranged in the non-display region.

12. The rollable display of claim 9, further comprising:
a housing configured to accommodate the polyhedral drum and the flexible panel;
a lead-out film comprising a first end coupled to the non-display region of the top portion and a second end led out via an aperture of the housing; and
a stopper coupled to the second end of the lead-out film and configured to pull the lead-out film outside the housing.

13. The rollable display of claim 12, further comprising a driving source configured to rotate the polyhedral drum.

14. The rollable display of claim 9, wherein the top portion is configured to be manually wound around or unwound from the polyhedral drum.

15. The rollable display of claim 1, wherein the polyhedral drum comprises eight flat surface portions and eight curved surface portions that alternate with each other.

* * * * *